United States Patent
Goodwin (10) Patent No.: US 7,286,205 B2
(45) Date of Patent: Oct. 23, 2007

(54) CLOSING DISK FOR IMMERSION HEAD

(75) Inventor: Francis Goodwin, Halfmoon, NY (US)

(73) Assignee: Infineon Technologies AG, Munich (DE)

( * ) Notice: Subject to any disclaimer, the term of this patent is extended or adjusted under 35 U.S.C. 154(b) by 253 days.

(21) Appl. No.: 11/114,566

(22) Filed: Apr. 25, 2005

(65) Prior Publication Data

US 2006/0238900 A1    Oct. 26, 2006

(51) Int. Cl.
G03B 27/52    (2006.01)
(52) U.S. Cl. ............................. 355/30; 355/53; 355/67
(58) Field of Classification Search .................. 355/30, 355/53, 67
See application file for complete search history.

(56) References Cited

U.S. PATENT DOCUMENTS

| | | | |
|---|---|---|---|
| 7,110,081 B2 * | 9/2006 | Hoogendam et al. | ......... 355/30 |
| 2004/0118184 A1 | 6/2004 | Violette | |
| 2004/0263809 A1 | 12/2004 | Nakano | |
| 2005/0030497 A1 | 2/2005 | Nakamura | |
| 2005/0046813 A1 | 3/2005 | Streefkerk, et al. | |

FOREIGN PATENT DOCUMENTS

EP    1 420 299 A2    5/2004
EP    1 647 865 A1    4/2006

OTHER PUBLICATIONS

"193 nm Immersion Lithography Rated Suitable for Fab Evaluation, Participants at International Sematech Conference Told," downloaded Apr. 20, 2005, pp. 1-4, Sematech, Inc., http://www.sematech.org/corporate/news/releases/20040127.htm.
"ASML leads the market with immersion lithography," downloaded Apr. 20, 2005, pp. 1-2, ASML, http://www.asml.com/NASApp/asmldotcom/printfriendly.do?ctx=168&rid=10668.
Geppert, L., "Chip Making's Wet New World," IEEE Spectrum, downloaded Apr. 20, 2005, pp. 1-8, IEEE, http://www.spectrum.ieee.org/WEBONLY/publicfeature/may04/0504lith.html.
"Technology Backgrounder: Immersion Lithography," downloaded Apr. 20, 2005, pp. 1-5, IC Knowledge, http://www.icknowledge.com/misc_technology/Immersion%20Lithography.pdf.

* cited by examiner

Primary Examiner—Henry Hung Nguyen
Assistant Examiner—Chia-how Michael Liu
(74) Attorney, Agent, or Firm—Slater & Matsil, L.L.P.

(57) ABSTRACT

A closing disk for an immersion head of an immersion lithography system is disclosed. The closing disk makes contact with the immersion head at the edges of the closing disk, but not the center, preventing damage to the bottom surface of the immersion head and also to the closing disk. The closing disk may be transparent or opaque, and may be aligned to the immersion head using optical or mechanical alignment.

31 Claims, 5 Drawing Sheets

CLOSING DISK FOR IMMERSION HEAD

TECHNICAL FIELD

The present invention relates generally to lithography systems used to manufacture semiconductor devices, and more particularly to cover plates or closing disks for immersion heads of immersion lithography systems.

BACKGROUND

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's).

For many years in the semiconductor industry, optical lithography techniques such as contact printing, proximity printing, and projection printing have been used to pattern material layers of integrated circuits. Projection printing is commonly used in the semiconductor industry using wavelengths of 248 nm or 193 nm, as examples. At such wavelengths, lens projection systems and transmission lithography masks are used for patterning, wherein light is passed through the lithography mask to impinge upon a wafer.

However, as the minimum feature sizes of IC's are decreased, the semiconductor industry is exploring the use of alternatives to traditional optical lithography techniques, in order to meet the demand for decreased feature sizes in the industry. For example, short wavelength lithography techniques, Scalpel, other non-optical lithographic techniques, and immersion lithography are under development as replacements for traditional optical lithography techniques.

One lithography technique under development is immersion lithography, in which the gap between the last lens or element in the optics system and a semiconductor wafer is filled with a liquid, such as water, to enhance system performance. The presence of the liquid enables the index of refraction in the image space, and therefore the numerical aperture of the projection system, to be greater than unity. Thus, immersion lithography has the potential to extend 193 nm tools used in lithography down to about 45 nm or below, for example.

Figure 1:
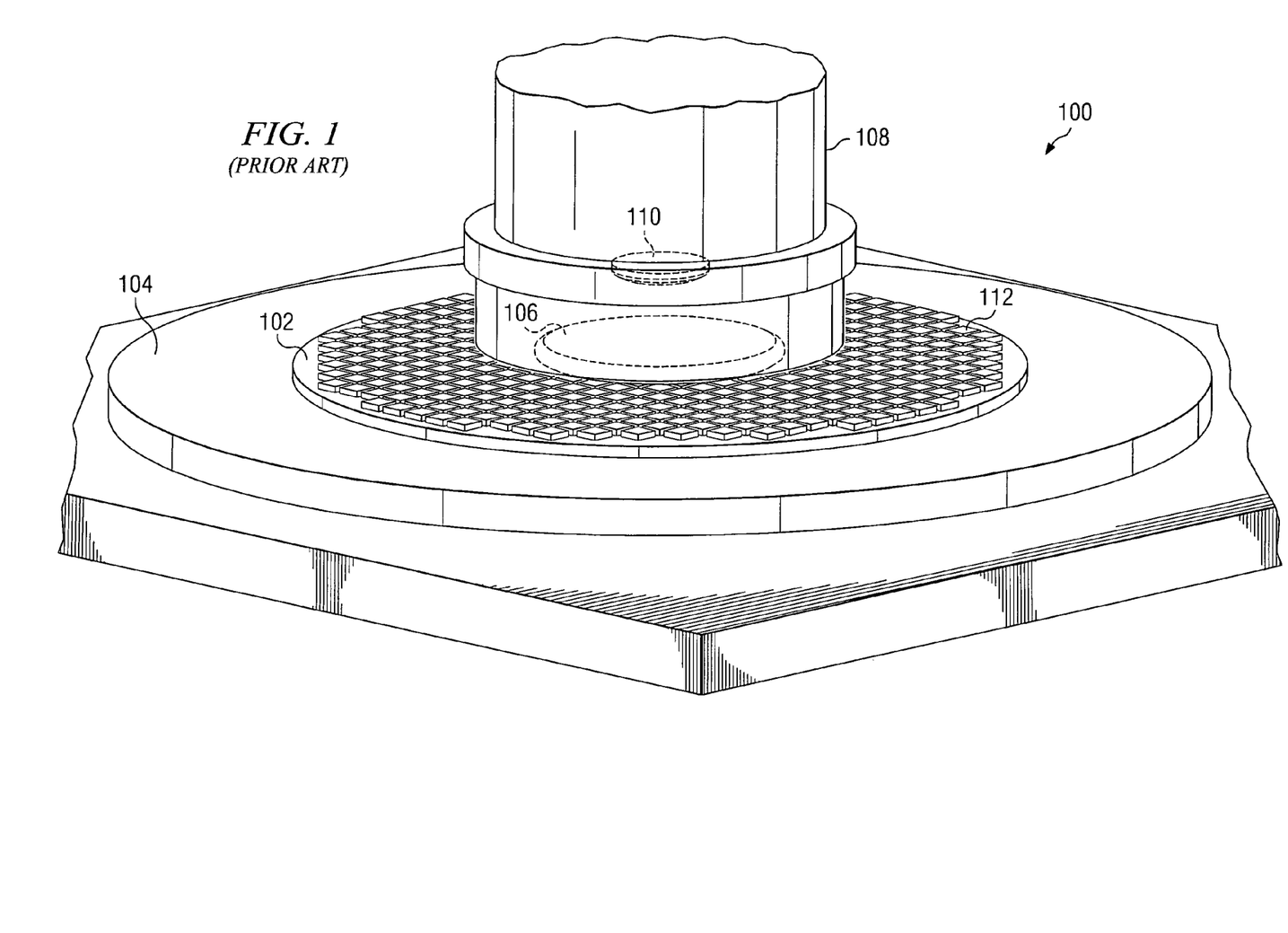
FIG. 1 is a perspective view of portion of a prior art immersion lithography system.

FIG. 1 shows a perspective view of portion of a prior art immersion lithography system. The prior art immersion lithography system is described in "IC Knowledge Technology Backgrounder: Immersion Lithography", from the website: http://www.icknowledge.com/misc_technology/Immersion%20Lithography.pdf, which is incorporated herein by reference. An immersion lithography system is described in further detail in U.S. patent application Ser. No. 2005/0046813 A1, published on Mar. 3, 2005, which is also incorporated herein by reference.

The portion of the immersion lithography system 100 shown in FIG. 1 includes a wafer 102 mounted on a wafer support 104. The wafer support 104 is also referred to as a wafer stage or exposure chuck, for example. A projection lens system 108 is disposed proximate the wafer 102. A fluid 106 such as water is disposed between the last element 110 of the lens system 108 during the lithography process, e.g., by an immersion head clamped to the end of the lens system 108 (not shown in FIG. 1: see FIG. 2 at 120). A stepper or scanner (not shown) moves the stage or wafer support 104 during the patterning of the individual die or regions of die 112 on the wafer 102. The fluid 106 is typically provided by a nozzle or by input and output ports within the immersion head 120 (see FIG. 2), for example.

Figure 2:
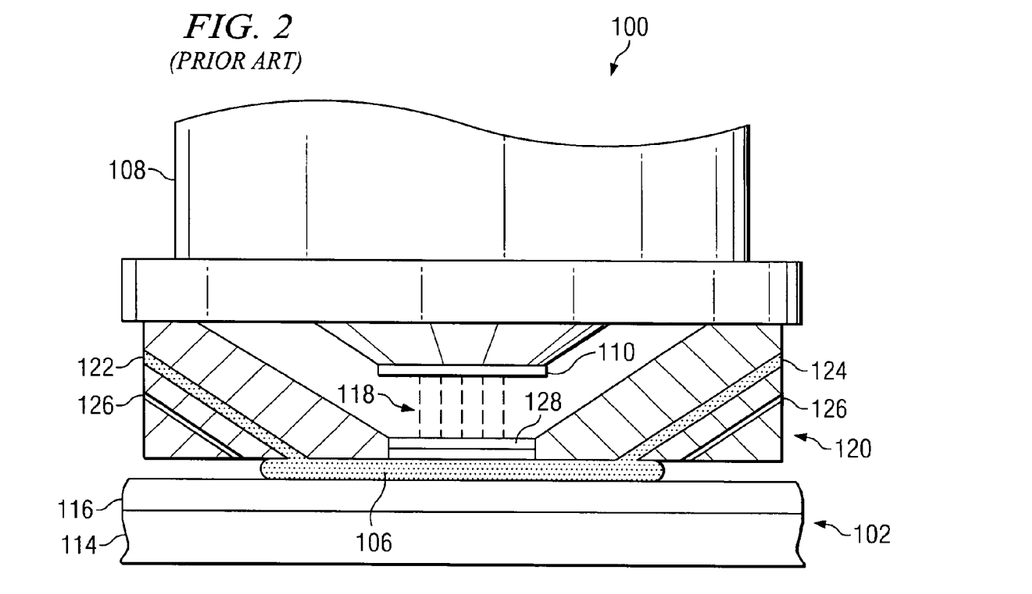
FIG. 2 is a cross-sectional view of the portion of the prior art immersion lithography system shown in FIG. 1.

FIG. 2 shows a more detailed cross-sectional view of the portion of the prior art immersion lithography system 100 shown in FIG. 1. The immersion lithography system 100 includes an immersion head 120 disposed proximate the last element 110 of the lens system 108. The immersion head 120 includes ports 122 and 124 for supplying the fluid 106 between the wafer 102 and the immersion head 120. The ports 122 and 124 may comprise input and output ports, for example. Hoses (not shown) may be coupled to the ports 122 and 124 for injecting $H_2O$ or other fluids, for example. The immersion head 120 typically includes a bottom plate 128 that is transparent, as shown. The bottom plate 128 keeps the liquid 106 from reaching the last element 110 of the lens system 108 and also prevents gases that may be outgassed from a photoresist 116 on the wafer 102 from reaching the last element 110, for example. The immersion head 120 may also include vacuum ports 126 disposed proximate the fluid ports 122 and 124. The vacuum ports 126 may be used to ensure that the fluid stays only immediately beneath the immersion head 120 central region, for example. An immersion head 120 such as the one shown in FIG. 2 is also referred to in the art as a shower head, for example.

The wafer 102 typically includes a workpiece 114 with a layer of radiation sensitive material 116 such as photoresist disposed thereon. The pattern from a mask or reticle (not shown) is imaged onto the photoresist 116 using a beam 118 of radiation or light emitted from the lens system 108. After exposure of the photoresist 116, the patterned photoresist 116 is later used as a mask while portions of a material layer (not shown) disposed over the workpiece 114 are etched away (also not shown).

Figure 3:
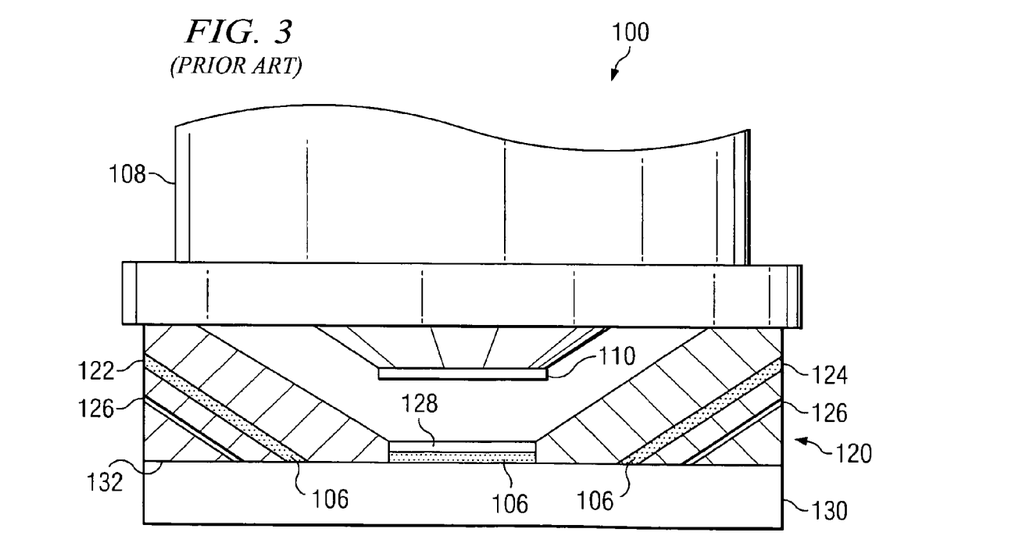
FIG. 3 illustrates a prior art closing disk that makes contact with a bottom surface of an immersion head, causing scratches to the immersion head bottom surface and to the closing disk.

FIG. 3 illustrates a prior art closing disk 130 that makes contact with a bottom surface 132 of an immersion head 120. The closing disk 130 is typically used to cover the immersion head 120 while a wafer 102 is being removed from the wafer support 104 (not shown in FIG. 3: see FIG. 1) and replaced with the next wafer 102 to be processed, for example. In an immersion lithography system 100, it is important to keep the immersion head 120 wet and to avoid drying of the fluid 106, in order to avoid forming drying stains from the fluid 106 on the bottom plate 128. Drying stains from the fluid 106 would reduce the intensity of the illumination energy that reaches the wafer 102 (see FIG. 2) and over time would diminish the resolution of the exposure tool or immersion lithography system 100, for example. Thus, the closing disk 130 is used to ensure that the bottom plate 128 of the immersion head 120 remains wet during wafer 102 exchanges, for example.

The closing disk 130 allows the wafer stage and exposure chuck 104 (see FIG. 1) to move from under the lens system 108 for removing an exposed wafer 102 from the exposure chuck 104 and loading of a new wafer 102. The closing disk 130 may be kept on the same wafer support 104 or may reside elsewhere proximate the immersion head 120, for example. The closing disk 130 is moved under the immersion head 120, and the immersion head 120 may lift the closing disk 130 using the vacuum ports 126, for example, or alternatively, the immersion head 120 may be placed in contact with the closing disk 130 while it remains positioned on a wafer support 104 (as shown in FIG. 1), for example.

A problem with the prior art closing disk 130 shown is that because direct contact is made to the entire bottom surface of the immersion head 120, the closing disk 130 can shift and scratch the immersion head 120 bottom surface 132. The top surface of the closing disk 130 can also become scratched during the contact with the immersion head 120 bottom surface 132, for example. This can create particulates, e.g., debris from the scratched immersion head 120 and/or closing disk 130, and the particulates can enter the fluid 106. The particulates can adhere to the immersion head 120 and can also be deposited onto the wafers 120 during exposure, resulting in decreased device yields, for example.

Furthermore, when the closing disk 130 is removed, the fluid 106 flows under the immersion head 120, because the fluid 106 typically continues to flow during the removal of the closing disk 130. Because the closing disk 130 comes into direct contact with the bottom surface 132 of the immersion head 120, no or little fluid 106 is present in those areas, creating thermal instability. As the immersion fluid 106 and the immersion head 120 are not temperature controlled, there is a period of time wherein the immersion fluid 106 is not thermally stable, when the closing disk 130 remains in place on the immersion head 120, as an example.

Thus, what are needed in the art are improved designs for closing disks of immersion lithography systems.

SUMMARY OF THE INVENTION

These and other problems are generally solved or circumvented, and technical advantages are generally achieved, by preferred embodiments of the present invention, which provide novel designs of closing disks for immersion heads of immersion lithography systems. The closing disks have a central region that extends downwardly away from the immersion head, preventing contact with the bottom surface of the immersion head and preventing damage to the immersion head and closing disk.

In accordance with a preferred embodiment of the present invention, a closing disk for an immersion head of an immersion lithography system includes a circular member having an edge region and a central region, the edge region including an upwardly extending portion that is adapted to be coupled to and received by the immersion head. The central region is curved downwardly away from the immersion head, preventing contact of the immersion head with the closing disk at the central region. The closing disk is adapted to provide a fluid seal for the immersion head.

In accordance with another preferred embodiment of the present invention, an immersion lithography system includes an immersion head having a bottom surface and including a lens element disposed proximate the bottom surface. The immersion head includes a fluid delivering means for delivering fluid to an object placed below the immersion head. The immersion lithography system includes a closing disk comprising a circular member having an edge region and a central region. The edge region of the closing disk includes an upwardly extending portion that is adapted to be coupled to and received by the immersion head. The central region of the closing disk is curved downwardly away from the immersion head, preventing contact of the immersion head with the closing disk at the central region. The immersion head includes an annular groove adapted to receive the upwardly extending portion of the closing disk. The closing disk seals the fluid provided by the fluid delivering means.

Advantages of preferred embodiments of the present invention include providing a closing disk that provides a fluid seal for an immersion head when the immersion head is not being used to pattern a semiconductor wafer. The closing disk prevents damage to the bottom surface of the immersion head and to the top surface of the closing disk. Thermal stability of the immersion head is improved, because fluid is retained beneath the immersion head in the space provided by the curved central region of the closing disk. Due to the novel shape of the closing disk and/or immersion head, the closing disk may be mechanically aligned to the immersion head, and the closing disk may comprise an opaque material.

The closing disk allows the bottom plate of the immersion head to remain wet, thus preventing the formation of drying stains on the bottom plate and maintaining the resolution of the exposure tool over time. Because the closing disk contacts the immersion head at a small amount of surface area, there is less likelihood that particulates will be formed that may adhere to the immersion head and be deposited onto wafers being exposed, thus increasing device yields for the semiconductor wafer being patterned using the immersion lithography system.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a closing disk for an immersion head of an immersion lithography system. The invention may also be applied, however, to other lithography systems or applications where a closing device is needed, for example.

Figure 4:
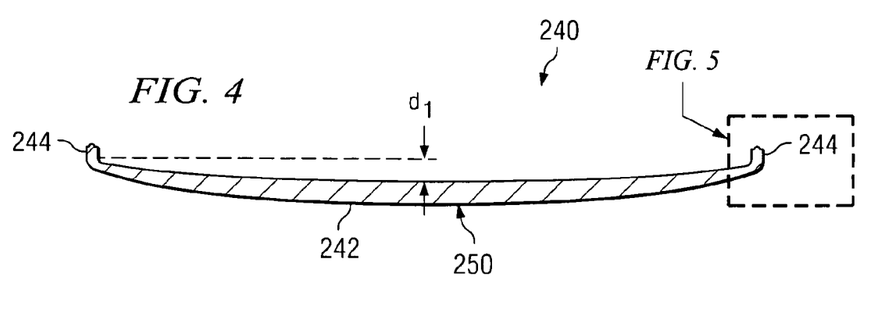
FIG. 4 shows a cross-sectional view of a closing disk in accordance with a preferred embodiment of the present invention.
Figure 5:
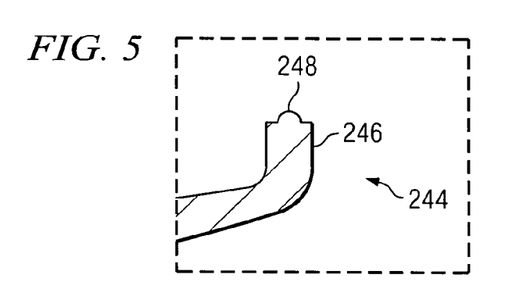
FIG. 5 shows a more detailed view of an edge region of the closing disk shown in FIG. 4.
Figure 6:
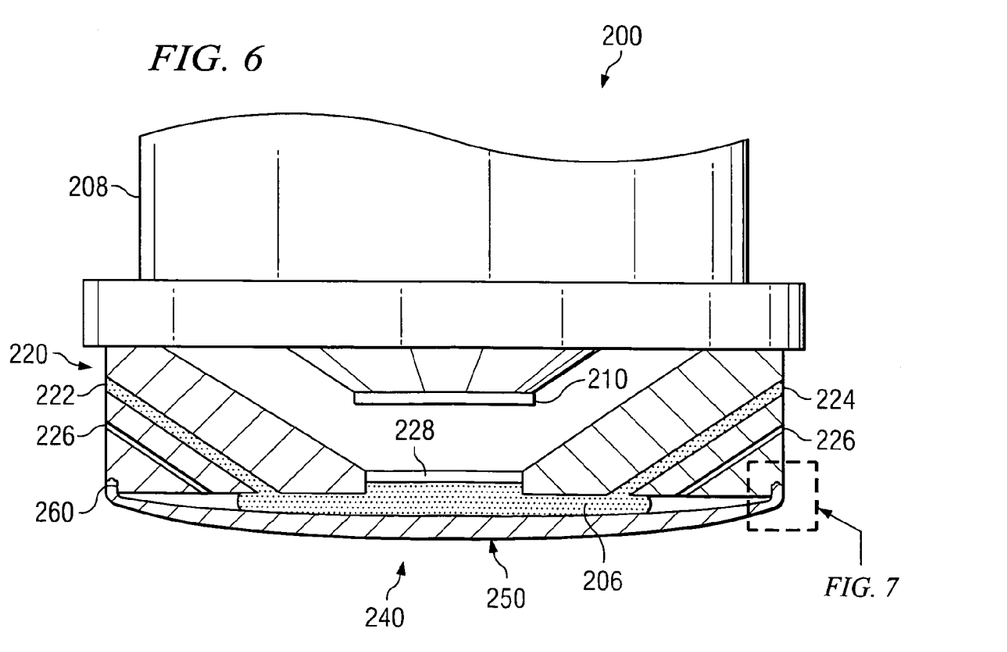
FIG. 6 shows a cross-sectional view of a closing disk in accordance with a preferred embodiment of the present invention, installed on an immersion head.

With reference now to FIG. 4, there is shown a cross-sectional view of a closing disk 240 in accordance with a preferred embodiment of the present invention. FIG. 5 shows a more detailed view of an edge region 244 of the closing disk 240 shown in FIG. 4. FIG. 6 shows a cross-sectional view of the closing disk 240 in accordance with a preferred embodiment of the present invention, installed on an immersion head 220 of an immersion lithography system 200. Note that in FIG. 6, like numerals are used for the elements of the immersion lithography system 200 as were used with reference to the immersion lithography system 100 shown in FIG. 3, and to avoid repetition, each element is not described in detail again herein.

The closing disk 240 in accordance with embodiments of the present invention preferably comprises a circular member. The circular member preferably has a diameter of about 120 to 150 mm, although alternatively, the circular member may comprise other dimensions. The circular member preferably comprises about the same dimensions and diameter as the bottom surface of the immersion head 220, in one embodiment, for example.

The circular member of the closing disk 240 preferably comprises a transparent, translucent, or opaque material. For example, the circular member may comprise quartz, calcium fluoride, plastic, a composite material, other materials, or combinations thereof. The closing disk 240 preferably comprises a thickness of about 500 μm to about 4 mm, for example, although alternatively, the closing disk 240 may comprise other dimensions.

The circular member of the closing disk 240 preferably comprises an edge region 244 and a central region 250, the edge region 244 including an upwardly extending portion 246 (see FIG. 5) that is adapted to be coupled to and received by an immersion head 220. The central region 250 of the closing disk 240 is preferably curved downwardly away from the immersion head 220, e.g., at curved region 242, shown in FIG. 4, preventing contact of the immersion head 220 with the closing disk 240 at the central region 250. The upwardly extending portion 246 may extend upward from the curved region 242 by about 3 mm or less, for example, although alternatively, the upwardly extending portion 246 may comprise other dimensions. When installed on the immersion head 220, the central region 250 of the closing disk 240 is adapted to be spaced apart from the immersion head 220 by a distance $d_1$ of about 3 mm or less, and more preferably by about 600 μm to about 2 mm, in one embodiment, for example, although alternatively, distance $d_1$ may comprise other dimensions.

The upwardly extending portion 246 of the edge region 244 includes a contact region 248, as shown in FIG. 5. The contact region 248 is adapted to make contact with the immersion head 220. The contact region 248 preferably comprises an annular ridge that extends upwardly towards the immersion head 220 from the upwardly extending portion 246 of the edge region 244. In the embodiment shown in FIG. 5, the cross-section of the annular ridge of the contact region 248 comprises a half-circle, as an example.

Referring to FIG. 6, the closing disk 240 is adapted to provide a fluid seal for the immersion head 220, e.g., to retain fluid 206 within the closing disk 240. Preferably, only the upwardly extending portion 246 of the edge region 244, e.g., the contact region 248, of the closing disk 240 makes contact with the immersion head 220, advantageously preventing damage to and/or scratching of the bottom surface of the immersion head 220 and also to the top surface of the closing disk 240, for example.

Figure 7:
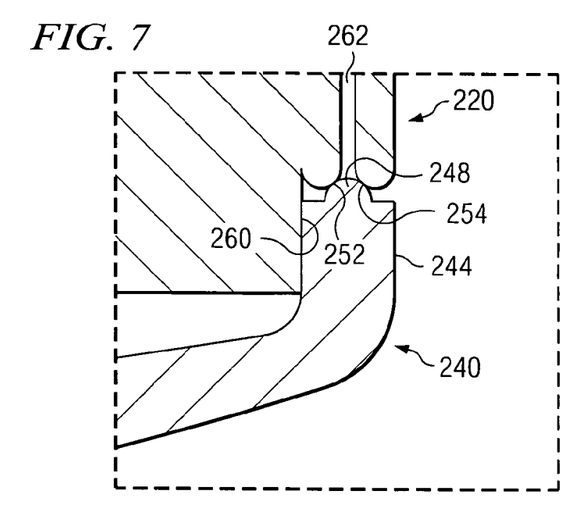
FIG. 7 shows a more detailed view of an edge region of the closing disk shown in FIG. 6, illustrating the contact points between the immersion head and the closing disk.

A more detailed view of the edge region 244 of the closing disk 240 when installed on an immersion head 220 is shown in FIG. 7. The annular ridge of the contact region 248 is preferably adapted to make contact with the immersion head 220 in a first region 254 and a second region 252 in a cross-section of the annular ridge, in one embodiment. For example, the first region 254 of the contact region 248 may be proximate an exterior circumference of the circular member of the closing disk 240, and the second region 252 of the contact region 248 may be disposed annularly within the first region 254.

Embodiments of the present invention also include an immersion head 220 adapted to be sealed with the closing disk 240. In particular, the immersion head 220 preferably comprises an annular groove 260 adapted to receive the upwardly extending portion 246 of the edge region 244 of the closing disk 240, as shown in FIG. 7. The annular groove 260 may be formed at an exterior surface of the immersion head 220, as shown, in one embodiment. In another embodiment, the annular groove 260 may be formed a distance away from the exterior surface of the immersion head 220 (not shown).

In one embodiment, the upwardly extending portion 248 of the closing disk 240 comprises a first ring. The annular groove 260 of the immersion head 220 in this embodiment preferably comprises a second ring and a third ring disposed within the second ring. The first ring of the closing disk 240 is adapted to sealingly couple within the second ring and the third ring of the immersion head 220, as shown in FIG. 7. In particular, the first ring of the closing disk 240 makes contact with the third ring of the immersion head 220 at region 252, and the first ring of the closing disk 240 makes contact with the second ring of the immersion head 220 at region 254. Advantageously, the three-ring configuration provides a self-aligning structure, so that optical alignment of the closing disk 240 is not necessarily required.

The immersion head 220 may also include a vacuum port 262 in one embodiment. The vacuum port 262 may be positioned within the second ring and third ring of the immersion head 220, as shown in FIG. 7. A vacuum may be applied using the vacuum port 262, to assist in adhering the closing disk 240 to the immersion head 220, for example.

Referring again to FIG. 6, embodiments of the present invention also include an immersion lithography system 200 including the novel immersion head 220 and the novel closing disk 240 described herein, for example. The immersion lithography system 200 preferably comprises an immersion head 220 having a bottom surface and including a lens element disposed proximate the bottom surface. The immersion head 220 includes a fluid delivering means 222/224 for delivering fluid 206 to an object placed below the immersion head 220. The immersion lithography system 200 includes a closing disk 240 comprising a circular member having an edge region 244 and a central region 250. The edge region 244 includes an upwardly extending portion 246 that is adapted to be coupled to and received by the immersion head 220, the central region 250 being curved downwardly away from the immersion head 220, preventing contact of the immersion head 220 with the closing disk 240 at the central region 250. The immersion head 220 includes an annular groove 260 adapted to receive the upwardly extending portion 246 of the closing disk 240, and the closing disk 240 seals the fluid 206 provided by the fluid delivering means, e.g., which may comprise ports 222 and 224 shown in FIG. 6.

Advantageously, the novel closing disk 240 may be aligned to the immersion head 220 using optical or mechanical alignment. For example, in one embodiment, the closing disk 240 comprises a transparent or translucent material so that optical alignment may be used. However, in another embodiment, the closing disk 240 may comprise an opaque material and may be aligned using only mechanical alignment.

Figure 8:
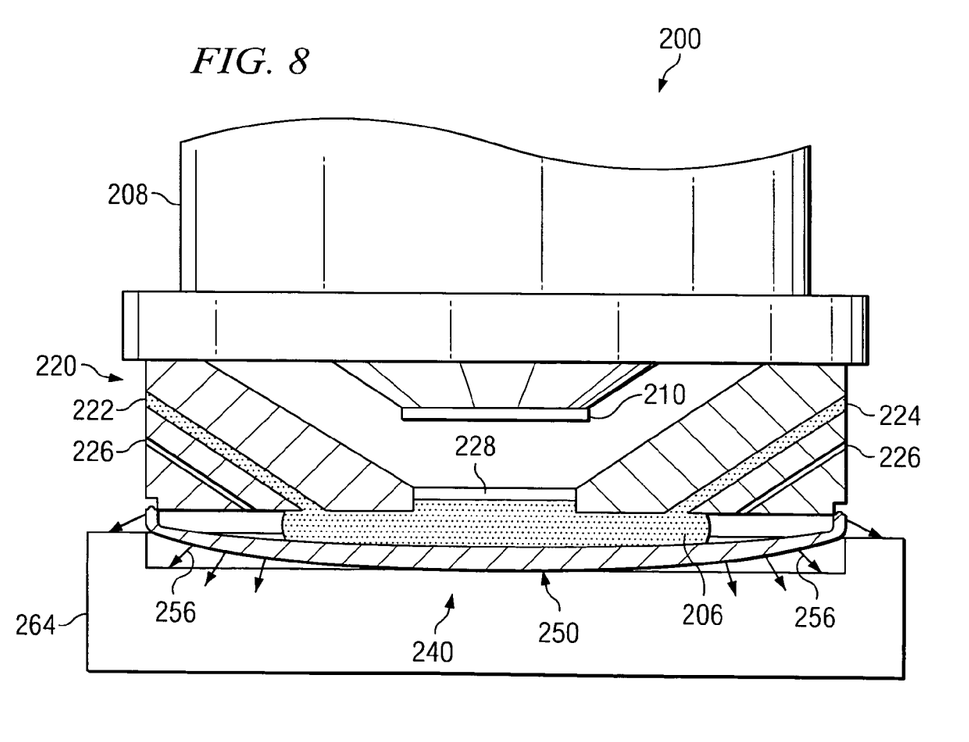
FIG. 8 illustrates that the closing disk may be mechanically aligned to the immersion head and that the curved design facilitates the removal of the closing disk from the immersion head.

FIG. 8 illustrates that the closing disk 240 may be mechanically aligned to the immersion head, e.g., by placing the closing disk 240 on a support 264 and positioning the closing disk 240 under the immersion head 220. The annular grooves 260 (not shown in FIG. 8: see FIG. 7) in the immersion head 220 guide the upwardly extending region 246 into the grooves 260. Also illustrated in FIG. 8, advantageously, the curved design of the closing disk 240 facilitates in the removal of the closing disk 240 from the immersion head 220. The curved structure or bow in the closing disk 240 causes the closing disk 240 to exert a force 256 upon removal: e.g., the closing disk 240 has a tendency to exert an outward force 256 due to its curved shape.

Figure 9:
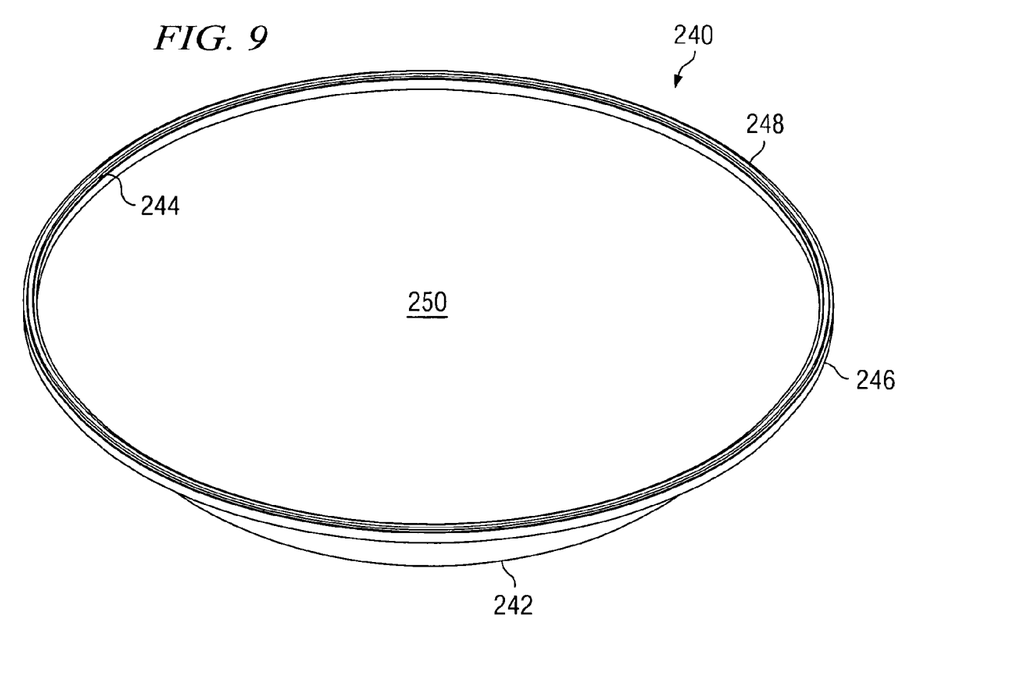
FIG. 9 shows a perspective view of the novel closing disk described herein.

FIG. 9 shows a perspective view of the novel closing disk 240 described herein, showing a view of the contact region 248 comprising an annular ring.

Figure 10:
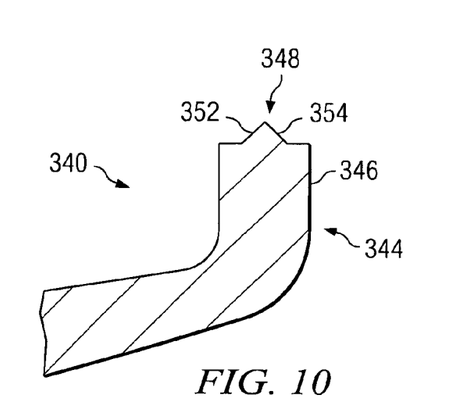
FIGS. 10 and 11 show alternative designs for the contact region of the closing disk.
Figure 11:
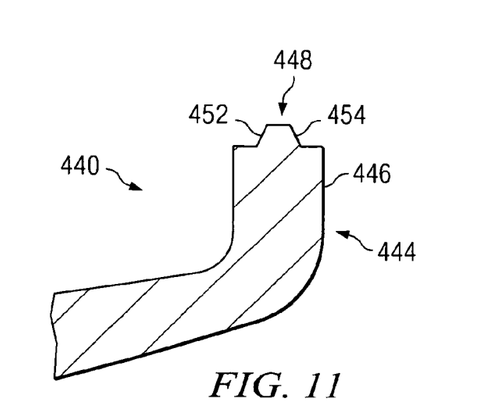

FIGS. 10 and 11 show alternative designs for the contact region 248 of the closing disk 240 described herein. Like numerals are used for the elements shown in FIGS. 10 and 11 as were used for the other figures previously herein. For example, as shown in FIG. 10, the cross-section of the annular ridge of the contact region 348 may comprise a triangle, wherein the contact points 352 and 354 reside along each side of the triangle. As another example, shown in FIG. 11, the cross-section of the annular ridge of the contact region 448 may comprise a trapezoid shape, wherein the contact points 452 and 454 reside along each side of the angled sides of the trapezoidal shape. Alternatively, the contact region 248/348/448 may comprise other shapes, for example, not shown.

Embodiments of the present invention also include methods of sealing an immersion head 220 using the novel closing disk 240 described herein, for example.

Advantages of embodiments of the invention include providing a closing disk 240 that provides a fluid seal for an immersion head 220 when the immersion head 220 is not being used to pattern a semiconductor wafer 202. The closing disk 240 prevents damage to the bottom surface of the immersion head 220 and to the top surface of the closing disk 240. Thermal stability of the immersion head 220 is improved, because fluid 206 is retained beneath the immersion head 220 in the space provided by the curved central region 250 of the closing disk 240.

Due to the novel shape of the closing disk 240 and/or immersion head 220, the closing disk 240 may be mechanically aligned to the immersion head 220, the closing disk 240 is easily removed, and the closing disk 240 may comprise an opaque material. For example, prior art closing disks such as disk 130 shown in FIG. 3 were required to comprise a transparent material because they required optical alignment. Thus, the material selections for prior art closing disks 130 were limited. The novel closing disk 240 described herein may be mechanically aligned, and thus more types of material may be used to manufacture the closing disks 240, for example.

The closing disk 240 allows the bottom plate 228 of the immersion head 220 to remain wet, thus preventing the formation of drying stains on the bottom plate 228 and maintaining the resolution of the exposure tool, e.g., the immersion lithography system 200, over time. Because the closing disk 240 contacts the immersion head 220 at a small amount of surface area, e.g., at contact region 248, 348 and 448, there is less likelihood that particulates form and adhere to the immersion head 220, and possibly be deposited onto wafers 202 being exposed, thus resulting in increased semiconductor device yields.

Another advantage of the novel closing disk 240 includes maintaining the temperature of the fluid 206 and the immersion head 220 while the immersion head 220 is not in use.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A closing disk for an immersion head of an immersion lithography system, the closing disk comprising:
    a circular member comprising an edge region and a central region, said central region formed to curve away from the edge region when said closing disk is in an unused state, the edge region including an upwardly extending portion that is adapted to be coupled to and received by the immersion head, wherein the central region is curved downwardly away from the immersion head, preventing contact of the immersion head with the closing disk at the central region, wherein the closing disk is adapted to provide a fluid seal for the immersion head.

2. The closing disk according to claim 1, wherein the upwardly extending portion includes a contact region adapted to make contact with the immersion head.

3. The closing disk according to claim 2, wherein the contact region comprises an annular ridge that extends upwardly towards the immersion head from the upwardly extending portion, wherein the annular ridge is adapted to make contact with the immersion head in a first region and a second region in a cross-section of the annular ridge.

4. The closing disk according to claim 3, wherein the first region of the contact region is proximate an exterior circumference of the circular member, and wherein the second region of the contact region is disposed annularly within the first region.

5. The closing disk according to claim 3, wherein the cross-section of the annular ridge comprises a half-circle, triangle, or trapezoid shape.

6. The closing disk according to claim 3, wherein, when installed on the immersion head, only the contact region makes contact with the immersion head, preventing damage to a bottom surface of the immersion head.

7. The closing disk according to claim 1, wherein, when installed on the immersion head, the central region of the closing disk is spaced apart from the immersion head by about 3 mm or less.

8. The closing disk according to claim 1, wherein the circular member has a diameter of about 120 to 150 mm.

9. The closing disk according to claim 1, wherein the closing disk comprises a transparent, translucent, or opaque material.

10. The closing disk according to claim 1, wherein the closing disk is adapted to be aligned to the immersion head using optical or mechanical alignment.

11. The closing disk according to claim 1, wherein the immersion head includes a fluid delivering means for delivering fluid to an object placed below the immersion head, wherein the closing disk seals the fluid provided by the fluid delivering means.

12. The closing disk according to claim 1, wherein the immersion head further includes a vacuum port, wherein the closing disk is adapted to be installed on the immersion head using the vacuum port.

13. An immersion head adapted to be sealed with the closing disk according to claim 1.

14. The immersion head according to claim 13, further comprising an annular groove adapted to receive the upwardly extending portion of the closing disk.

15. The immersion head according to claim 14, further comprising a vacuum port opening into the annular groove, wherein a vacuum may be applied using the vacuum port to assist in adhering the closing disk to the immersion head.

16. The immersion head according to claim 14, wherein the upwardly extending portion of the closing disk comprises a first ring, wherein the annular groove of the immersion head comprises a second ring and a third ring disposed within the second ring, and wherein the first ring of the closing disk is adapted to sealingly couple within the second ring and the third ring of the immersion head.

17. An immersion lithography system including the immersion head and the closing disk according to claim 14.

18. A method of sealing an immersion head, comprising: providing a closing disk in accordance with claim 1; and sealing the linmersion head with the closing disk.

19. An immersion lithography system, comprising:
an immersion head having a bottom surface, the immersion head including a lens element disposed proximate the bottom surface and a fluid delivering means for delivering fluid to an object placed below the immersion head; and
a closing disk comprising a circular member having an edge region and a central region, the edge region including an upwardly extending portion that is adapted to be coupled to and received by the immersion head, the central region being curved downwardly away from the immersion head, preventing contact of the immersion head with the closing disk at the central region, wherein the immersion head includes an annular groove adapted to receive the upwardly extending portion of the closing disk, and wherein the closing disk seals the fluid provided by the fluid delivering means.

20. The immersion lithography system according to claim 19, wherein the immersion head comprises a first diameter, wherein the closing disk comprises a second diameter, wherein the second diameter is substantially equal to the first diameter.

21. The immersion lithography system according to claim 19, wherein only the upwardly extending portion of the edge region of the closing disk makes contact with the immersion head, preventing damage to the bottom surface of the immersion head.

22. The immersion lithography system according to claim 19, wherein, when installed on the immersion head, the central region of the closing disk is adapted to be spaced apart from the immersion head by about 3 mm or less, and wherein the closing disk retains fluid below at least a portion of the bottom surface of the immersion head.

23. The immersion lithography system according to claim 19, wherein the closing disk comprises a transparent, translucent, or opaque material, and wherein the closing disk is adapted to be aligned to the immersion head using optical or mechanical alignment.

24. The immersion lithography system according to claim 19, wherein the immersion head further includes a vacuum port, wherein the closing disk is adapted to be installed on the immersion head using the vacuum port.

25. The immersion lithography system according to claim 24, wherein the vacuum port of the immersion head opens into the annular groove, wherein a vacuum may be applied using the vacuum port to assist in adhering the closing disk to the immersion head.

26. The immersion lithography system according to claim 19, wherein the upwardly extending portion of the closing disk comprises a first ring, wherein the annular groove of the immersion head comprises a second ring and a third ring disposed within the second ring, and wherein the first ring of the closing disk is adapted to sealingly couple within the second ring and the third ring of the immersion head.

27. An immersion lithography system, comprising:
an immersion head having a bottom surface, the immersion head including a lens element disposed proximate the bottom surface and a fluid delivering means for delivering fluid to an object placed below the immersion head; and
a closing disk having an edge region and a central region, said central region formed to curve away from the edge region when said closing disk is in an unused state and wherein the closing disk is adapted to contact the immersion head at the edge region but not the central region, and wherein the closing disk is adapted to seal the fluid provided by the fluid delivering means of the immersion head.

28. The immersion lithography system according to claim 27, wherein the central region of the closing disk is curved downwardly away from the immersion head, preventing contact of the immersion head with the closing disk at the central region.

29. The immersion lithography system according to claim 27, wherein the edge region includes an upwardly extending portion, wherein the upwardly extending portion of the edge region of the closing disk makes contact with the immersion head.

30. The immersion lithography system according to claim 29, wherein the immersion head includes an annular groove adapted to receive the upwardly extending portion of the closing disk.

31. The immersion lithography system according to claim 30, wherein the upwardly extending portion of the closing disk comprises a first ring, wherein the annular groove of the immersion head comprises a second ring and a third ring disposed within the second ring, and wherein the first ring of the closing disk is adapted to sealingly couple within the second ring and the third ring of the immersion head.

* * * * *

UNITED STATES PATENT AND TRADEMARK OFFICE
CERTIFICATE OF CORRECTION

PATENT NO. : 7,286,205 B2 Page 1 of 1
APPLICATION NO. : 11/114566
DATED : October 23, 2007
INVENTOR(S) : Goodwin It is certified that error appears in the above-identified patent and that said Letters Patent is hereby corrected as shown below:

In Col. 9, line 42, delete "linmersion" and insert --immersion--.

Signed and Sealed this

Twenty-fifth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,286,205 B2 Page 1 of 1
APPLICATION NO. : 11/114566
DATED : October 23, 2007
INVENTOR(S) : Goodwin It is certified that error appears in the above-identified patent and that said Letters Patent is hereby corrected as shown below:

In Col. 9, line 22, delete "scaled" and insert --sealed--.

Signed and Sealed this

Twenty Second Day of April, 2008

JON W. DUDAS
*Director of the United States Patent and Trademark Office*